US009343350B2

(12) United States Patent
Arai

(10) Patent No.: US 9,343,350 B2
(45) Date of Patent: May 17, 2016

(54) ANTI-SLIP END EFFECTOR FOR TRANSPORTING WORKPIECE USING VAN DER WAALS FORCE

(71) Applicant: ASM IP Holding B.V., Almere (NL)

(72) Inventor: Izumi Arai, Nagaoka (JP)

(73) Assignee: ASM IP Holding B.V., Almere (NL)

( * ) Notice: Subject to any disclaimer, the term of this patent is extended or adjusted under 35 U.S.C. 154(b) by 107 days.

(21) Appl. No.: 14/244,689

(22) Filed: Apr. 3, 2014

(65) Prior Publication Data
US 2015/0287626 A1 Oct. 8, 2015

(51) Int. Cl.
*H01L 21/687* (2006.01)
*H01L 21/677* (2006.01)

(52) U.S. Cl.
CPC .... *H01L 21/68707* (2013.01); *H01L 21/67742* (2013.01)

(58) Field of Classification Search
CPC ............ H01L 21/683; H01L 21/67706; H01L 21/67739; H01L 21/67748; H01L 21/6831; H01L 21/68728; B25J 15/0014; B25J 15/0019; B25J 15/0085
USPC .................................................. 294/213, 902
See application file for complete search history.

(56) References Cited

U.S. PATENT DOCUMENTS

| 6,976,822 | B2 * | 12/2005 | Woodruff | H01L 21/67265 294/213 |
| 7,055,875 | B2 * | 6/2006 | Bonora | H01L 21/6838 294/188 |
| 7,290,813 | B2 * | 11/2007 | Bonora | H01L 21/68707 294/103.1 |
| 7,479,198 | B2 * | 1/2009 | Guffrey | C09J 7/02 134/26 |
| 7,748,760 | B2 * | 7/2010 | Kushida | H01L 21/67259 294/106 |
| 8,192,901 | B2 * | 6/2012 | Kageyama | G03F 1/24 355/75 |
| 8,720,965 | B2 * | 5/2014 | Hino | H01L 21/67742 294/103.1 |
| 8,764,085 | B2 * | 7/2014 | Urabe | H01L 21/68707 294/103.1 |
| 8,820,809 | B2 * | 9/2014 | Ando | H01L 21/67265 294/213 |
| 8,864,202 | B1 * | 10/2014 | Schrameyer | B25J 15/0014 294/213 |
| 8,967,608 | B2 * | 3/2015 | Mitsumori | C23C 14/50 269/21 |
| 8,991,887 | B2 * | 3/2015 | Shin | H01L 21/67742 294/183 |

(Continued)

FOREIGN PATENT DOCUMENTS

JP 2012-089837 5/2012

OTHER PUBLICATIONS

Liu, et al. "Research, Design, and Experiment of End Effector for Wafer Transfer Robot," Industrial Robot: An International Journal pp. 79-91 (2012).*

(Continued)

*Primary Examiner* — Kaitlin Joerger
(74) *Attorney, Agent, or Firm* — Snell & Wilmer LLP

(57) ABSTRACT

An anti-slip end effector for transporting a workpiece, configured to be attached to a robotic arm, includes: a workpiece-supporting area for placing a workpiece thereon for transportation; and at least one anti-slip protrusion disposed in the workpiece-supporting area for supporting a backside of the workpiece, said anti-slip protrusion having a top face capable of contacting and adhering to the backside of the workpiece by van der Waals force and capable of pivoting on a pivot axis, said pivot axis being disposed away from a center of the top face as viewed from above.

15 Claims, 8 Drawing Sheets

(56) References Cited

U.S. PATENT DOCUMENTS

| | | | | |
|---|---|---|---|---|
| 2006/0113806 A1* | 6/2006 | Tsuji | ........... | H01L 21/68707 294/213 |
| 2009/0033907 A1* | 2/2009 | Watson | ........... | G03F 7/707 355/75 |
| 2012/0100464 A1 | 4/2012 | Kageyama | | |
| 2012/0315113 A1* | 12/2012 | Hiroki | ........... | B65G 49/061 414/217 |
| 2012/0325148 A1* | 12/2012 | Yamagishi | ........ | H01L 21/68742 118/723 R |
| 2013/0180448 A1* | 7/2013 | Sakaue | ........... | H01L 21/67739 118/696 |
| 2013/0330165 A1* | 12/2013 | Wimplinger | ...... | H01L 21/67288 414/800 |
| 2014/0056679 A1* | 2/2014 | Yamabe | ........... | B25J 9/042 414/749.1 |
| 2014/0227072 A1* | 8/2014 | Lee | ........... | H01L 21/68707 414/744.3 |
| 2015/0174768 A1* | 6/2015 | Rodnick | ........... | H01L 21/677 414/744.2 |

OTHER PUBLICATIONS

Article (both in Japanese and Translated) entitled "Gecko Tape Using Carbon Nanotubes" by Youhei MAENONitto Denko Gihou 90th issue (vol. 47) 2009, pp. 48-51.

Article dated Jun. 26, 2007, Carbon nanotube-based synthetic gecko tapes, by Liehui Ge*, Sunny Sethi*, Lijie Ci†, Pulickel M. Ajayan†, and Ali Dhinojwala*‡*Department of Polymer Science, University of Akron, Akron, OH 44325-3909; and †Department of Materials Science and Engineering, Rensselaer Polytechnic Institute, Troy, NY 12180-3590; Communicated by Jacob N. Israelachvili, University of California, Santa Barbara, CA, Apr. 17, 2007 (vol. 104, No. 26) pp. 10792-10795.

* cited by examiner

ANTI-SLIP END EFFECTOR FOR TRANSPORTING WORKPIECE USING VAN DER WAALS FORCE

BACKGROUND OF THE INVENTION

1. Field of the Invention

The present invention generally relates to an end effector for transporting a workpiece such a semiconductor wafer between a transferring chamber and a processing chamber for processing a workpiece, for example.

2. Description of the Related Art

A process of semiconductor manufacturing includes a step of transporting a semiconductor wafer from a wafer-storing cassette to a processing chamber via a transferring chamber using a robotic arm or a step of transporting a semiconductor wafer from a processing chamber to another processing chamber using a robotic arm. The robotic arm is provided with an end effector for loading a wafer thereon and carrying the wafer from one chamber to another. Typically, the end effector does not have a mechanical clamping mechanism for clamping a wafer, and by a wafer positioning or alignment mechanism (e.g., those disclosed in U.S. Patent Application Publication No. 2012/0325148, U.S. Pat. No. 7,963,736, and U.S. Pat. No. 8,041,450, each disclosure of which is herein incorporated by reference in its entirety), a wafer is placed on the end effector for transfer. The wafer stays on the end effector while being carried by friction against a surface of the end effector, which is caused by gravity. As throughput is increased, the transferring speed by the robotic arm is also increased. When the transferring speed is increased, since the wafer stays on the end effector by friction, the wafer sometimes moves relative to the end effector and slips out of place, thereby causing a transfer error and decreasing transfer stability.

Further, when a wafer is transferred in a vacuum atmosphere in order to suppress generation of particles, use of a mechanical clamp or an end effector having sloped periphery protrusions for receiving the periphery of a wafer thereon is difficult. That is, with use of a mechanical clamp, when the mechanical clamp contacts a wafer, the mechanical clamp may damage a film near the edge of the wafer, generating particles. Also, with use of the end effector having sloped periphery protrusions, when a wafer slips downward along the sloped periphery protrusions for positioning the wafer, the edge of the wafer rubs against the sloped periphery protrusions, generating particles. Further, an electrostatic chuck has problems in requiring charging and discharging time, and adsorbing particles. Thus, placing a semiconductor wafer on support pins of an end effector and carrying the wafer slowly may be preferable as a method for transporting a semiconductor wafer. However, as mentioned above, the method has a demerit that transportation speed cannot be increased.

At least one embodiment of the present invention can effectively resolve at least one of the above problems. It should be noted that any discussion of problems and solutions involved in the related art has been included in this disclosure solely for the purposes of providing a context for the present invention, and should not be taken as an admission that any or all of the discussion were known at the time the invention was made.

SUMMARY OF THE INVENTION

Some embodiments provide a method for transporting a wafer by an end effector without using the conventional methods, thereby resolving at least one of the problems of the conventional methods. In some embodiments, a pad generating van der Waals force is provided on an interface between an end effector and a wafer so that the wafer adheres to and is retained by the end effector, thereby preventing the wafer from slipping from the end effector. An adsorption pad, for example, retains a wafer by utilizing van der Waals force generated by the adsorption pad contacting the backside of a wafer. Also, the adsorption pad has a configuration allowing a wafer to be gradually separated from a contacting area of the adsorption pad by tilting the adsorption pad relative to the backside of the wafer. Accordingly, the adsorption pad can retain a wafer without contacting a bevel portion or an edge portion of the wafer, and the wafer can withstand force generated by acceleration or deceleration during transportation, thereby making it possible to significantly increase transportation speed of the wafer while preventing the wafer from slipping from the adsorption pad. Further, unlike an electrostatic chuck, charging and discharging time is not required. The adsorption pad may be characterized in that the pad also has a function of supporting a wafer, like supporting pins, and thus, any additional pins can be eliminated. Further, although a face of the adsorption pad contacting a wafer may be analogous to a conventional adhesive tape or the like, unlike with the conventional adhesive tape, the wafer can easily be separated from the adsorption pad.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DETAILED DESCRIPTION OF EMBODIMENTS

Figure 1:
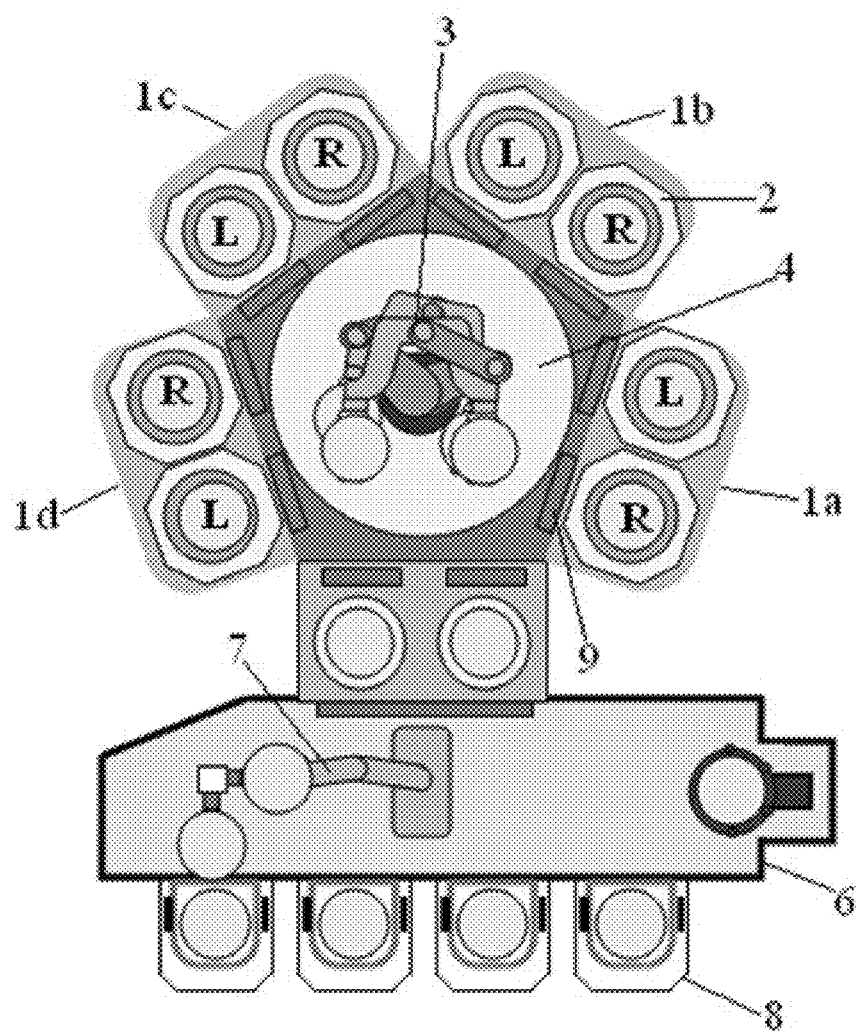
FIG. 1 is a schematic plan view of a semiconductor-processing apparatus with dual-chamber modules usable in some embodiments of the present invention.

In this disclosure, an article "a" or "an" refers to a species or a genus including multiple species. Further, in this disclosure, any two numbers of a variable can constitute a workable range of the variable as the workable range can be determined based on routine work, and any ranges indicated may include or exclude the endpoints. In all of the disclosed embodiments, any element used in an embodiment can be replaced with any elements equivalent thereto, including those explicitly, necessarily, or inherently disclosed herein, for the intended purposes. Additionally, any values of variables indicated (regardless of whether they are indicated with "about" or not) may refer to precise values or approximate values and include equivalents, and may refer to average, median, representative, majority, etc. in some embodiments. The word "constituted by" refers to "comprising", "consisting essentially of", or "consisting of" in some embodiments. In this disclosure, any defined meanings do not necessarily exclude ordinary and customary meanings in some embodiments.

In the present disclosure where conditions and/or structures are not specified, the skilled artisan in the art can readily provide such conditions and/or structures, in view of the present disclosure, as a matter of routine experimentation.

In some embodiments, a dielectric film (which is a continuous layer) can be formed on a wafer or semiconductor substrate by plasma-enhanced CVD, thermal CVD, cyclic CVD, plasma-enhanced ALD, thermal ALD, radical-enhanced ALD, or any other thin film deposition methods. Typically, the thickness of the dielectric film is in a range of about 5 nm to about 500 nm.

The embodiments will be explained with respect to preferred embodiments. However, the present invention is not limited to the preferred embodiments.

An embodiment provides an anti-slip end effector for transporting a workpiece, configured to be attached to a robotic arm and comprising: (i) a workpiece-supporting area for placing a workpiece thereon for transportation; and (ii) at least one anti-slip protrusion disposed in the workpiece-supporting area for supporting a backside of the workpiece, said anti-slip protrusion having a top face capable of contacting and adhering to the backside of the workpiece by van der Waals force and capable of pivoting on a pivot axis, said pivot axis being disposed away from a center of the top face as viewed from above. In some embodiments, the at least one anti-slip protrusion consists of one anti-slip protrusion disposed in the vicinity of a center of the workpiece-supporting area. In some embodiments, the at least one anti-slip protrusion consists of multiple anti-slip protrusions distributed in the workpiece-supporting area in a way such that the weight of the workpiece is evenly distributed on each anti-slip protrusion. In some embodiments, the multiple anti-slip protrusions are disposed in the workpiece-supporting area at locations which are left-right symmetrical and front-rear symmetrical relative to the center of the workpiece-supporting area and relative to the loading direction of the workpiece placed on the end effector toward a chamber. In some embodiments, the number of the anti-slip protrusions is 1, 2, 3, 4, 5, 6, 7, or 8.

In the above, the top face of the anti-slip protrusion is a face constituted by points of contact which contact the backside of the workpiece when the workpiece is loaded on an end effector. In some embodiments, the size of the top face is about 4 $mm^2$ to about 400 $mm^2$, preferably about 25 $mm^2$ to about 100 $mm^2$, and the shape of the top face is a rectangle, circle, oval, triangle, polygon, diamond, etc. as viewed from above.

The top face is capable of pivoting on a pivot axis which is disposed away from a center of the top face as viewed from above. Because the pivot axis is disposed away from the center of the top face, when the workpiece relatively moves away from the top face (i.e., the workpiece ascends relative to the end effector, the end effector descends relative to the workpiece, or both), force in a lateral direction is generated toward the center of the top face, thereby causing the top face to pivot on the pivot axis. The pivoting movement of the top face makes the top face easy to separate from the backside of the workpiece when the workpiece relatively moves away from the top face.

In order to cause the top face to adhere to the backside of the workpiece by van der Waals force, microscopic hair such as that of the sole of the foot of a gecko can effectively be used against the backside of the workpiece which has typically a surface roughness on the order of micron meters. In some embodiments, the backside of the workpiece has a mirror-like finish, and the backside of the workpiece may have a surface roughness of 4 nm or less (typically about 1 nm or less).

In some embodiments, the top face of the anti-slip protrusion is constituted by numerous carbon nanotubes. In some embodiments, the length of carbon nanotubes may be in an range of about 10 nm to about 2 mm, typically about 50 nm to about 1,000 nm, and the diameter of carbon nanotubes may be in a range of about 2 nm to about 100 nm, typically about 5 nm to about 50 nm, and the density of carbon nanotubes may be in a range of about $10^8$ to about $10^{11}/cm^2$, typically about $10^9$ to about $10^{10}/cm^2$.

In some embodiments, the at least one anti-slip protrusion is constituted by multiple anti-slip protrusions disposed left-right symmetrically relative to a center line of the end effector extending from a proximal end to a distal end of the end effector, and the pivot axis of each anti-slip protrusion is disposed perpendicular to a line passing through a center of the workpiece-supporting area as viewed from above. In the above, since all of the top faces move along the lines passing through the center of the workpiece-supporting area when the workpiece relatively moves away from the end effector, the top faces move closer to or away from each other, and because the workpiece does not extend or shrink, the top faces are separated from the backside of the workpiece without significant or substantial lateral displacement of the workpiece.

In some embodiments, the anti-slip protrusion has (i) a base portion through which the pivot axis passes, and (ii) a top portion formed directly or indirectly on top of the base portion and extending in one direction roughly parallel to the workpiece-supporting area, wherein a top surface of the top portion constitutes the top face. In some embodiments, the base portion has roughly an inverted triangle cross section, wherein the pivot axis passes through the base portion at a location near the lower end of the inverted triangle cross section. In the above embodiments, the base portion can easily and stably pivot on the pivot axis. In some embodiments, the height of the top portion may be in a range of about 0.5 mm to about 7.0 mm, typically about 1.0 mm to about 3.0 mm, and the height of the base portion may be in a range of about 2.0 mm to about 28.0 mm, typically about 2.0 mm to about 5.0 mm, depending on the thickness of the end effector. In some embodiments, the workpiece-supporting area has a recess inside which the base portion of the anti-slip protrusion is disposed, and the top portion of the anti-slip protrusion is disposed above the recess. The size of the recess should be sufficient to allow the base portion to rock on the pivot axis in the recess. In some embodiments, a backside of the top portion of the anti-slip protrusion is in contact with a surface of the workpiece-supporting area at a home position, and the anti-slip protrusion is capable of pivoting in a manner moving the top portion of the anti-slip protrusion away from the surface of the workpiece-supporting area. Alternatively, the base portion of the anti-slip protrusion can be installed in the workpiece-supporting area without a recess.

In some embodiments, the top face formed on the top portion of the anti-slip protrusion is curved toward an end of the top portion on the extended side. Due to the curved portion, separation of the backside of the workpiece does not occur suddenly, but occurs gradually because an area of contact on the curved portion which is in contact with the backside of the workpiece moves along the curved portion as the workpiece relatively moves away from the end effector. In some embodiments, the curvature of the curved portion may increase toward the end of the extended portion of the top face, where the top face at the end of the extended portion is set at about 90° relative to the plane of the workpiece-supporting area.

In some embodiments, the top face is constituted by a carbon nanotube-based synthetic gecko tape attached to a top surface of the anti-slip protrusion which is made of a material selected from the group consisting of ceramics, silicon, glass, and resin. As a gecko tape, any suitable gecko tapes can be used, such as that available from Nitto Denko KK., Japan and described in "Carbon nanotubes-based synthetic gecko tapes", Liehui Ge, et al., PNAS, Jun. 26, 2007, vol. 104, no. 26, pp. 10792-10795, the disclosure of which is incorporated herein by reference it its entirety. In some embodiments, the top face is constituted by carbon nanotubes directly deposited on a top surface of the anti-slip protrusion which is made of silicon, using, e.g., catalytic chemical vapor deposition (CCVD) wherein carbon nanotubes can grow to reach a height of about 500 μm to about 700 μm on an $Fe/Al_2O_3$ layer formed on the Si substrate.

In some embodiments, the workpiece-supporting area is constituted by ceramics, carbon composite, and aluminum alloys. In some embodiments, the pivot axis is constituted by a metal pin (e.g., stainless steel pin) penetrating through a portion of the base portion near the lower end where a through hole is formed in the base portion. Alternatively, the pivot axis can be formed using recesses on the sides of the base portion in place of the through hole, wherein the base portion is rotatably supported by short pins engaged with the recesses.

In some embodiments, the anti-slip protrusion pivots so as to return to the home position by gravity after pivoting in a manner moving the top portion of the anti-slip protrusion away from the surface of the workpiece-supporting area. In the above embodiments, since the anti-slip protrusion returns to the home position by gravity after being separated from the backside of the workpiece, no special returning mechanism is required when repeating the workpiece transportation process.

In some embodiments, the top face formed on the top portion of the anti-slip protrusion has a contacting area which is brought into contact with the backside of the workpiece at the home position, wherein the contacting area is located between the pivot axis and the end of the top portion on the extended side as viewed from above. In the above embodiments, because the contacting area is located between the pivot axis and the end of the extended portion, when the workpiece relatively moves away from the end effector, the top face easily pivots on the pivot axis due to the angular moment or moment of rotation torque, achieving gradual separation of the top face from the backside of the workpiece. In some embodiments, the top face formed on the top portion of the anti-slip protrusion is curved between the contacting area and the end of the top portion on the extended side.

In some embodiments, the top face formed on the top portion of the anti-slip protrusion has an oblong shape which is longer in a direction perpendicular to the pivot axis than in a direction of the pivot axis as viewed from above, whereby stable operation can be realized.

In some embodiments, the top face of the at least one anti-slip protrusion is the only area which contacts the backside of the workpiece when the workpiece is placed on the workpiece-supporting area. In some embodiments, the end effector further comprises at least one front protrusion disposed at a distal end of the workpiece-supporting area for engaging an edge of the workpiece to restrict movement of the workpiece placed on the workpiece-supporting area beyond the front protrusion, and at least one rear protrusion disposed at a proximal end of the workpiece-supporting area for engaging an edge of the workpiece to restrict movement of the workpiece placed on the workpiece-supporting area beyond the rear protrusion, wherein the backside of the workpiece is additionally in contact with the front protrusion and the rear protrusion formed on the end effector, wherein the workpiece is placed between the front and rear protrusions.

In some embodiments, the backside of the workpiece is constituted by Si, $SiO_2$, SiN, SiC, or gallium arsenide (GaAs). Typically, the workpiece is a Si wafer, and the backside thereof is constituted by silicon; however, the backside of the wafer can be coated with a film such as that made of $SiO_2$, SiN, SiC, or gallium arsenide (GaAs).

Another aspect of the present invention provides a robotic arm for transporting a workpiece, comprising at least one arm which is movable vertically, front and rear, and laterally, and any of the anti-slip end effectors disclosed herein attached to a distal end of each arm.

Still another aspect of the present invention provides a method of transporting a workpiece using any of the foregoing anti-slip end effectors disclosed herein, comprising: (a) providing a robot arm to which the end effector is attached; (b) loading a workpiece on the workpiece-supporting area of the end effector, wherein the backside of the workpiece is attached to the top face of each anti-slip protrusion; (c) transporting the workpiece from one chamber to another chamber using the robot arm while keeping the workpiece on the workpiece-supporting area of the end effector; and (d) unloading the workpiece in the other chamber by moving the workpiece from the end effector, wherein the top face of each anti-slip protrusion pivots on the pivot axis and is gradually detached from the backside of the workpiece while moving the workpiece away from the end effector.

The present invention will be explained below with reference to the drawings, which are used merely by way of example and are not intended to limit the present invention.

Figure 3:
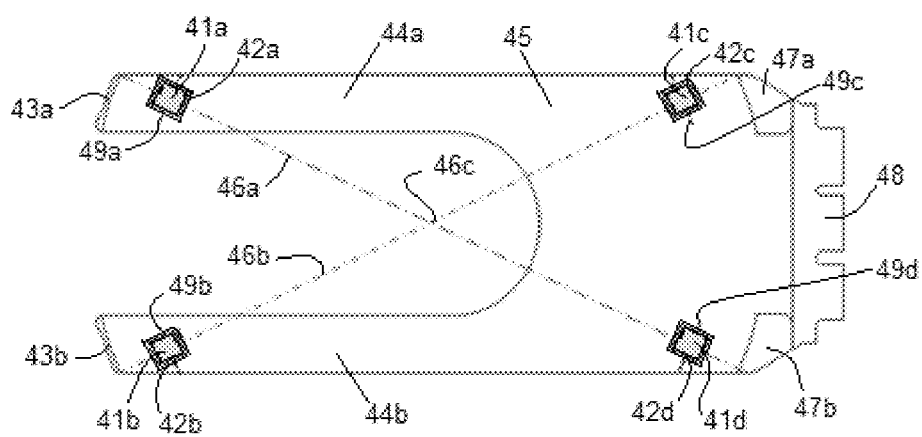
FIG. 3 is a schematic plan view of an end effector according to an embodiment of the present invention.

FIG. 3 is a schematic plan view of an end effector according to an embodiment of the present invention. The end effector is constituted by a paddle 45, a left blade 44b and a right blade 44a extending from the paddle 45, and a joint section 48 configured to be attached to a robotic arm. The paddle 45 also has holes (now shown) for securing the end effector to the robotic arm. The distal ends of blade 44b, 44a are provided with front protrusions 43b, 43a, respectively, for inhibiting a wafer from dropping from the end effector in the event that the wafer slips. The front protrusions also can be used for positioning the wafer on the end effector. The proximal end of the paddle 45 also has rear protrusions 47b, 47a for restricting displacement of the wafer. Near the distal end, the right blade 44a has a recess 42a, to which a pad (anti-slip protrusion) 41a is rotatably installed in the recess 42a using a spring pin 49a as a pivot axis. The pivot axis is disposed perpendicular to a line 46a passing through a center 46c of a workpiece-supporting area 62 (see FIG. 5) as viewed from above.

The left blade 44b has the same structure where a pad 41b is rotatably installed in a recess 42b with a spring pin 49b near the distal end. The pivot axis constituted by the spring pin 49b is disposed perpendicular to a line 46b passing through the center 46c of the workpiece-supporting area 62 (see FIG. 5) as viewed from above. The paddle 45 also has pads 41c, 41d rotatably installed in recesses 42c, 42, respectively, near the proximal end close to the respective side peripheries. The pivot axes constituted by spring pins 49c, 49d, respectively, are disposed perpendicular to the lines 46b, 46a, respectively, passing through the center 46c. The multiple anti-slip protrusions 41a to 41d are disposed left-right symmetrically and also front-rear symmetrically relative to a center line of the end effector extending from the proximal end (rear end) to the distal end (front end) of the end effector and a line passing through the center 46c perpendicular to the center line.

Figure 4:
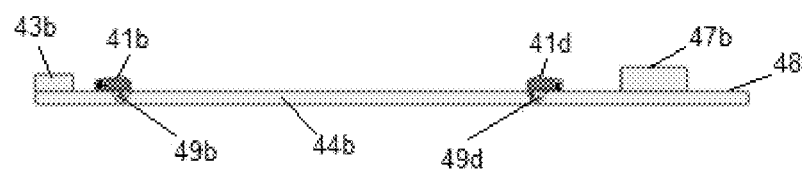
FIG. 4 is a schematic side view of the end effector illustrated in FIG. 3.

FIG. 4 is a schematic side view of the end effector illustrated in FIG. 3. The spring pins 49b, 49d are inserted from the side of the end effector which has boreholes on the side so that the spring pins 49b, 49d penetrate through through-holes of the pads 41b, 41d, respectively, and reach the other sides of the recesses 42b, 42d, respectively. The spring pins 49a, 49b also are inserted from the other side of the end effector in the same manner as with the spring pins 49b. 49d.

Figure 8:
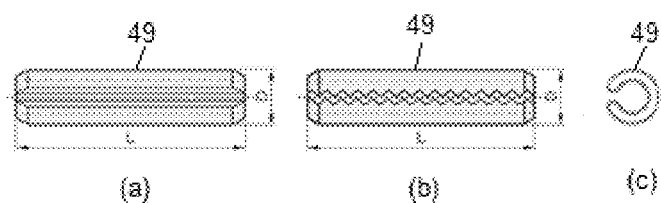
FIG. 8 consists of (a) an illustration of a schematic front view of a spring pin for pivoting an anti-slip protrusion body according to an embodiment of the present invention, (b) an illustration of a schematic front view of a spring pin for pivoting an anti-slip protrusion body according to another embodiment of the present invention, and (c) an illustration of a schematic side view of the spring pin illustrated in (b).

FIG. 8 illustrates a schematic front view (a) of a spring pin 49 according to an embodiment of the present invention, a schematic front view (b) of a spring pin 49 according to another embodiment of the present invention, and a schematic side view (c) of the spring pin 49 illustrated in (b). In some embodiments, the length (L) of the spring pin is about 5 mm to about 30 mm, and the diameter (D) thereof is about 1 mm to about 3 mm. The spring pin in (a) has a groove along the length direction, whereas the spring pin in (b) is hollow with an opening formed along the length direction as illustrated in (c). The pin need not be of this type, but any suitable pin can be used.

Figure 5:
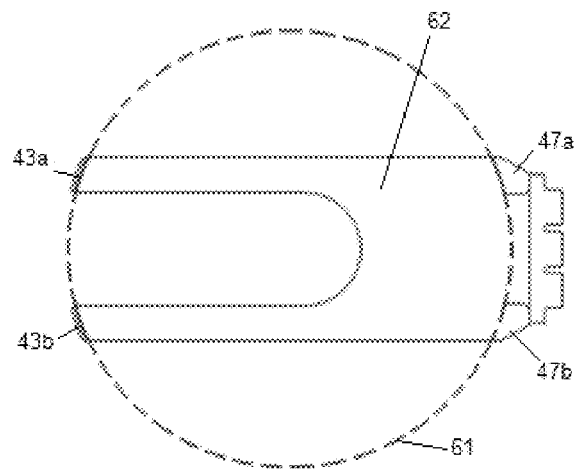
FIG. 5 is a schematic plan view of an end effector illustrated in FIG. 3, showing a wafer-supporting area.

The workpiece-supporting area is defined by the front protrusions 43b, 43a, and the rear protrusions 41c, 41d. FIG. 5 is a schematic plan view of the end effector illustrated in FIG. 3, showing a wafer-supporting area 61 wherein a wafer to be placed is indicated with a broken line. In some embodiments, the end effector including the workpiece-supporting area is constituted by $Al_2O_3$ and has a length of about 300 mm, for example. The height of the front protrusions 43a, 43b from the top surface of the end effector is about 2.3 mm, for example, the height of the anti-slip protrusions 41a, 41b, 41c, 41d from the top surface is about 1.5 mm (typically but not always shorter than the front and rear protrusions), for example, and the height of the rear protrusions 47a, 47b from the top surface is about 2.5 mm, for example. The above variable numbers can be modified by +50% in some embodiments.

Figure 6:
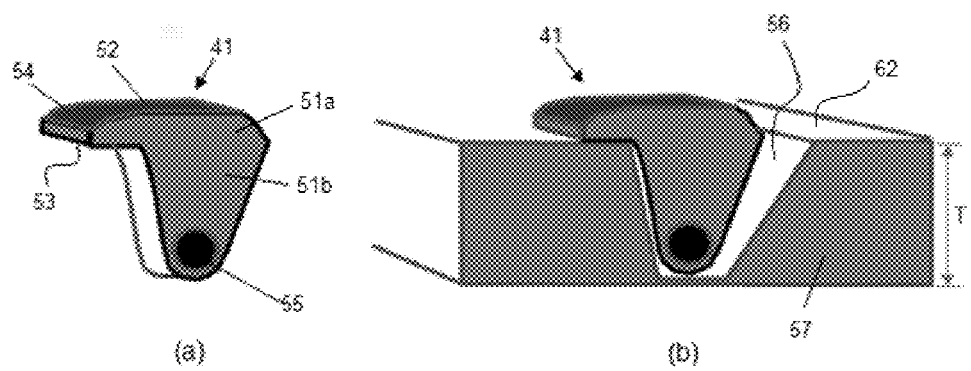
FIG. 6 consists of (a) an illustration of an anti-slip protrusion body according to an embodiment of the present invention, and (b) an illustration of structures where the anti-slip protrusion is installed in an end effector according to an embodiment of the present invention.

FIG. 6 consists of (a) an illustration of an anti-slip protrusion body (pad) 41 according to an embodiment of the present invention, and (b) an illustration of structures where the anti-slip protrusion is installed in an end effector according to an embodiment of the present invention. The anti-slip protrusion has (i) a base portion 51b with a through-hole 55 through which the pivot axis passes, and (ii) a top portion 51a formed on top of the base portion 51b and extending in one direction roughly parallel to the workpiece-supporting area 62, wherein a top surface of the top portion constitutes a top face 52. The top portion 51a has an extended portion 53 whose a bottom surface is in contact with a surface of the workpiece-supporting area 62, and the top face 52 has a curved area 54 at the extended portion 53. The anti-slip protrusion body 41 is rotatably installed in a recess 56 formed in an end effector 57 which has a thickness (T) of about 3 mm to about 9 mm. The top face has anti-slip property by way of van der Waals force. The recess 56 need not have a bottom, but can be bottom-less (i.e., a through hole).

Figure 7:
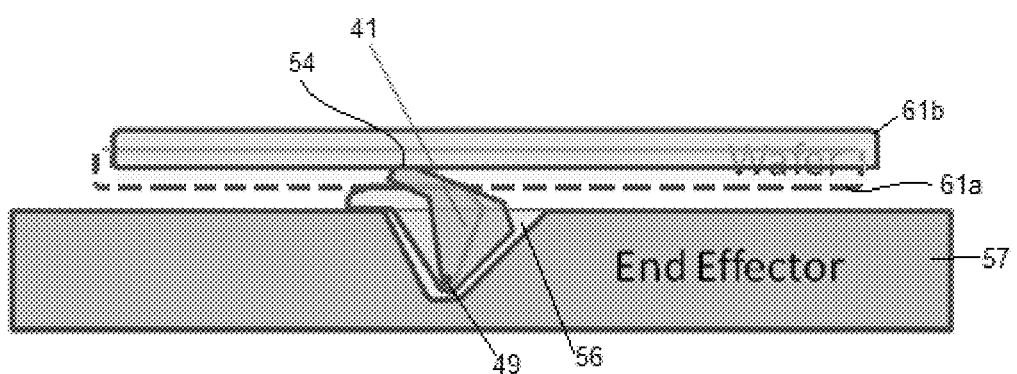
FIG. 7 is a schematic side view of an end effector illustrating movement thereof when a wafer is lifted according to an embodiment of the present invention.

FIG. 7 is a schematic side view of an end effector illustrating movement thereof when a wafer relatively moves away from the end effector according to an embodiment of the present invention. The anti-slip protrusion body 41 is rotatably installed in a recess 56 formed in an end effector 57 so as to pivot on a pivot axis 49. When the anti-slip protrusion body 41 is at a home position where the bottom of the extended portion is in contact with a surface of the workpiece-supporting area, the backside of a wafer 61a indicated with a broken line is in contact with a top surface of the top face so that the wafer 61a is stably and securely transported to another location while adhering to the anti-slip protrusion body 41 due to the anti-slip property of the top face of the anti-slip protrusion body 41. When the wafer 61b relatively moves away from the end effector 57, the backside of the wafer 61b begins separating from the top face of the anti-slip protrusion body 41 while the anti-slip protrusion body 41 is pivoting on the pivot axis 49. Since the top face has a curved area 54 at the extended portion, separation of the wafer from the top face does not occur suddenly, but occurs gradually because the contacting area between the backside of the wafer and the top face does not suddenly become zero, but is gradually reduced as the wafer is relatively moving away from the end effector. Although due to the rotation of the anti-slip protrusion body, lateral displacement of the wafer may slightly occur, it is insignificant because all the anti-slip protrusion bodies are moved toward the center of the workpiece-supporting area in this embodiment as illustrated in FIG. 3.

Figure 9:
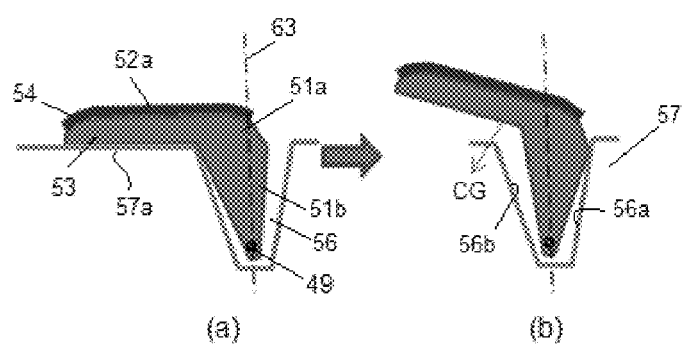
FIG. 9 consists of (a) an illustration of a side view of an anti-slip protrusion body at a home position, and (b) an illustration of a side view of the anti-slip protrusion body at a top position according to an embodiment of the present invention.

FIG. 9 consists of (a) an illustration of a side view of an anti-slip protrusion body at a home position, and (b) an illustration of a side view of the anti-slip protrusion body at a top position according to an embodiment of the present invention.

A top face formed on a top portion 51a of an anti-slip protrusion has a contacting area 52a which is brought into contact with the backside of a workpiece at a home position, wherein a substantial part or all of the contacting area 52a as illustrated in (a) is located between a pivot axis 49 formed in a base portion 51b and the tip of an extended portion 53 as viewed from above (a line 63 indicates a position of the pivot axis 49 as viewed from above). The base portion 51b is inside a recess 56 of an end effector 57, and at the home portion, the backside of the extended portion 53 sits on and is in contact with a surface 57a of the end effector 57 as illustrated in (a). The top face has not only the contacting area 52a but also a curved area 54 at the extended portion 53 so that the curved area 54 comes in contact with the backside of the wafer when the wafer is relatively moving away from the end effector at a top position as illustrated in (b), whereby sudden separation of the contacting area 52a from the backside of the workpiece can effectively be prevented. As the workpiece relatively moves away from the end effector, the anti-slip protrusion body pivots, and the backside of the extended portion 53 moves away from the top surface 57a, and a front side of the base portion 51b moves away from a front wall 56b of the recess 56. When the rear side of the base portion 51b comes in contact with a rear wall 56a of the recess 56, pivoting movement of the base portion 51b is stopped at the top position as illustrated in (b). At the top position, the curved area 54 which is in contact with the backside of the workpiece starts separating from the backside of the workpiece as the workpiece continuously relatively moves away from the end effector. When the curved area 54 separates from the backside of the workpiece, the anti-slip protrusion body returns to the home position by gravity without any special mechanism since the center of gravity (CG) is located between the pivot axis 49 and the tip of the extended portion 53 as viewed from above. In order to promote the returning movement of the anti-slip protrusion body, the angle of the rear wall 56a of the recess 56 (which is greater than the angle of the front wall 56a of the recess 56 relative to the horizontal direction), and the extended length of the extended portion 53 can be adjusted, so that the center of gravity of the anti-slip protrusion body is located between the pivot axis 49 and the tip of the extended portion 53 at a position closer to the tip of the extended portion 53 as viewed from above.

Figure 10:
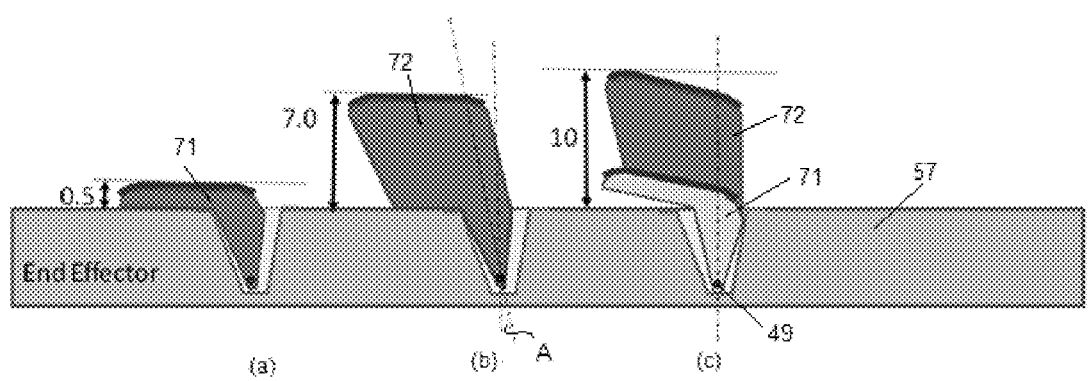
FIG. 10 is a schematic side view for illustrating end effectors having various heights at a home position marked with (a) and (b) and at a separating position marked with (c) according to embodiments of the present invention.

FIG. 10 is a schematic side view for illustrating end effectors having various heights at a home position marked with (a) and (b) and at a separating position marked with (c) according to embodiments of the present invention. In some embodiments, the minimum height of a top portion of an anti-slip protrusion body 71 is about 0.5 mm as illustrated in (a), and the maximum height of a top portion of an anti-slip protrusion body 72 is about 7.0 mm as illustrated in (b). When the anti-slip protrusion body 71, 72 pivots on a pivot axis 49 in a clockwise direction in this figure as a workpiece relatively moves away from the end effector, the curved area of the contacting area comes in contact with the backside of a workpiece and then is separated therefrom at the maximum height (i.e., at a top position). In some embodiments, the maximum height is about 10 mm as illustrated in (c). In some embodiments, the anti-slip protrusion body may rotate or pivot on the pivot axis 49 from the home position to the top position at an angle (A) of about 50 to about 30°, typically about 8° to about 20°.

Figure 11:
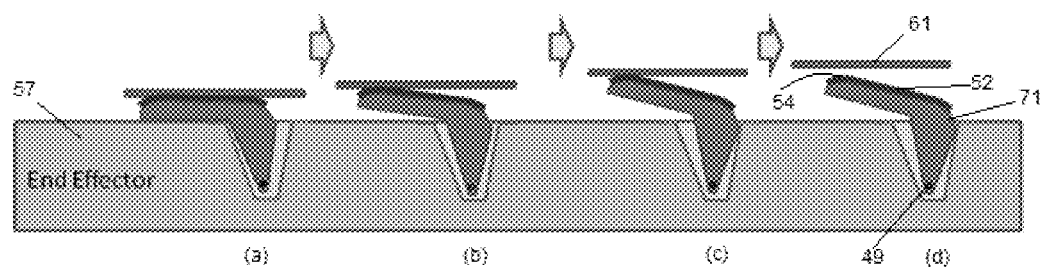
FIG. 11 is a schematic side view for illustrating movement of an end effector as rotating from a home position marked with (a) to a separating position marked with (d) according to embodiments of the present invention.

FIG. 11 is a schematic side view for illustrating movement of an end effector as rotating from a home position marked with (a) to a separating position marked with (d) according to embodiments of the present invention. A top face 52 of an anti-slip protrusion body 71 has the maximum area or degree of contact with the backside of a workpiece 61 at the home position as illustrated in (a). When the workpiece 61 begins moving up away from the end effector (or the end effector 57 begins moving down away from the workpiece 61), the area or degree of contact between the top face 52 and the backside of the workpiece decreases as the anti-slip protrusion body 71 pivots on the pivot axis 49 away from the top surface of the end effector 57 as illustrated in (b). When the workpiece 61 continuously moves up (or the end effector continuously moves down), the anti-slip protrusion body is about to reach the top position where a top part of the anti-slip protrusion body is about to reach the highest point relative to the end effector, where mainly a curved area 54 is in contact with the backside of the workpiece 61, and thus, the area or degree of contact between the top face 52 and the backside of the workpiece becomes less as illustrated in (c). When the anti-slip protrusion body reaches the top position where the top part of the anti-slip protrusion body reaches the highest point relative to the end effector (the anti-slip protrusion body stops rotating), where only the curved area 54 is in contact with the backside of the workpiece 61, and thus, the area or degree of contact between the top face 52 and the backside of the workpiece becomes the minimum, and the backside of the workpiece 61 and the curved area 54 separate as the workpiece and the end effector are kept moving away from each other as illustrated in (d). As illustrated in this figure, as the workpiece and the end effector gradually move away from each other, the area or degree of contact between the backside of the workpiece and the contacting area of the anti-slip protrusion body is gradually reduced, thereby effectively preventing sudden jumping or abrupt movement of the workpiece.

Figure 12:
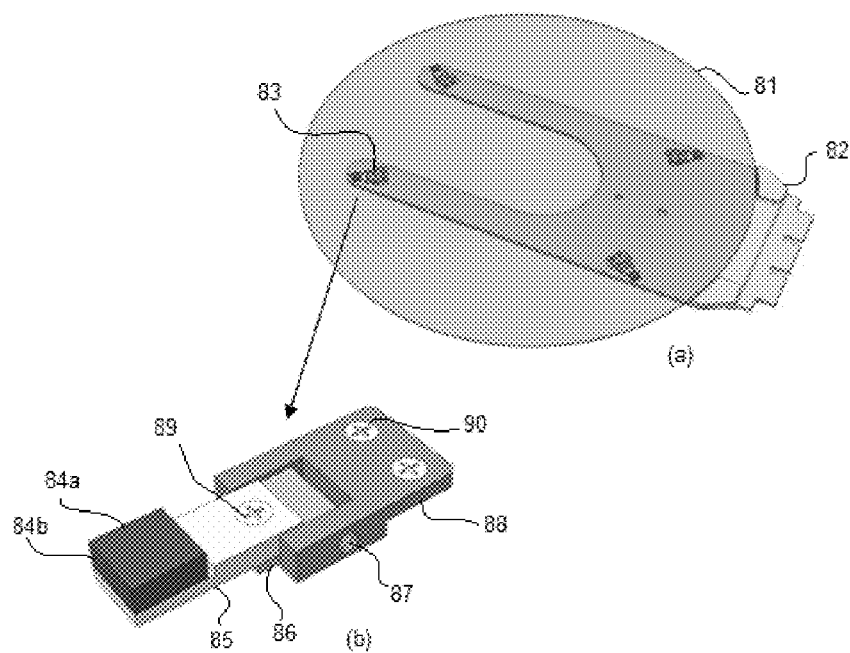
FIG. 12 consists of (a) an illustration of a schematic perspective view of an end effector with a phantom workpiece according to an embodiment of the present invention, and (b) an illustration of a schematic perspective view of the anti-slip protrusion body installed in the end effector illustrated in (a).

FIG. 12 consists of (a) an illustration of a schematic perspective view of an end effector 82 with a phantom workpiece 81 according to an embodiment of the present invention, and (b) an illustration of a schematic perspective view of the anti-slip protrusion body 83 installed in the end effector 82 illustrated in (a). This anti-slip protrusion body 83 is installed in the end effector 82 in a manner similar to that illustrated in FIG. 3, wherein the horizontal axis of each anti-slip protrusion body 83 is directed to the center of the workpiece-supporting area, and each anti-slip protrusion body 83 is rotatable in a manner wherein its top face moves toward the vertical axis of the workpiece-supporting area. The anti-slip protrusion body 83 is constituted by an integrated unit as illustrated in (b), which is composed of a non-movable portion and a movable portion which is further composed of a non-replaceable portion and a replaceable portion. The non-movable portion is constituted by a support portion 88 which is fixed to the end effector by screws 90, for example. The movable portion is constituted by a base portion 86 which is pivoted to the support portion 88 and is capable of pivoting on a pivot axis 87, and a top portion 84b is attached to the base portion 86 via a connector 85, which connector 85 is fixed to the base portion 86 by a screw 89, for example. The top portion 84b is provided with a top face 84a. Thus, the top portion 84b including the top face 84a with the connector 85 are replaceable when the top face 84a is degraded, for example, without replacing the support portion 88 and the base portion 86. The top face 84a is capable of contacting and adhering to the backside of a workpiece by van der Waals force. For example, a gecko tape is attached to the pad 84b or carbon nanotubes are deposited on the top portion 84b, constituting the top face 84a.

Figure 13:
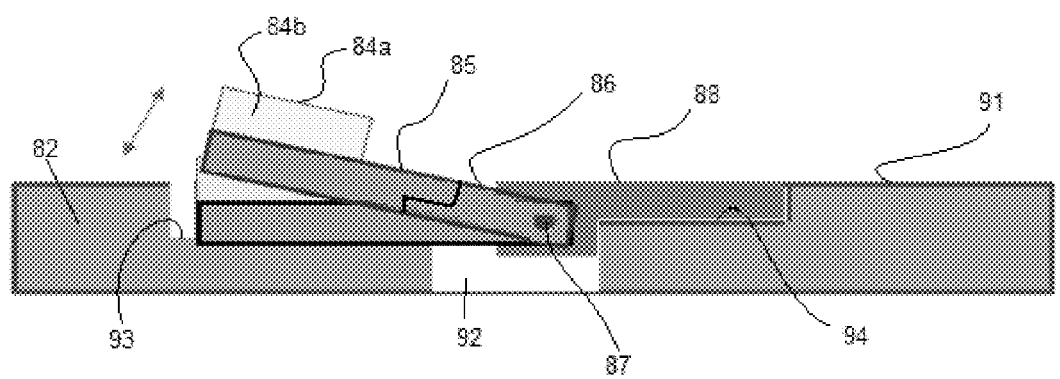
FIG. 13 is a schematic section view of an anti-slip protrusion body, illustrating rotational movement thereof according to an embodiment of the present invention.

FIG. 13 is a schematic section view of the anti-slip protrusion body, illustrating rotational movement thereof according to an embodiment of the present invention. This figure is more simplified than that shown in FIG. 12 to show the installation of the anti-slip protrusion body and rotational movement thereof. The end effector 82 has a through hole 92 with a front recessed step 93 and a rear recessed step 94 which are disposed in the front and rear of the through hole 92. The support portion 88 is fixedly attached to the rear recessed step 94. The top portion 84b, the connector 85, and the base portion 86 are integrated and rotate together on the pivot axis 87 which passes through the support portion 88 and the base portion 86. The connector 85 is laid on the front recessed step 93 at the home position, where the top face 84a is higher than a top surface 91 of the end effector 82, so that the top face 84a is in contact with and adheres to the backside of the workpiece which backside is not in contact with any other portions of the end effector (the periphery of the workpiece may be in contact with protrusions provided on a top surface of the end effector for positioning purposes; however, some embodiments can avoid the above periphery contact). As the workpiece relatively moves away from the end effector 82, the top portion 84b, the connector 85, and the base portion 86 rotate on the pivot axis 87 since the top face 84a adheres to the backside of the workpiece by van der Waals force, and the connector 85 and the base portion 86 move away from the front recessed step 93 as illustrated in FIG. 13. In this configuration, the center of gravity of the anti-slip protrusion body is disposed clearly between the pivot axis 87 and the distal end of the top portion 85 as viewed from above. Thus, the anti-slip protrusion body can reliably return to the home position by gravity after the top face 84a separates from the backside of the workpiece. Further, since the configuration is simple, the anti-slip protrusion body can easily and inexpensively be installed in the end effector. Furthermore, the top portion can be replaceable without replacing the base portion, saving cost. In some embodiments, the top portion 84b is made of aluminum which is provided with carbon nanotubes-based tape (also known as "Gecko tape") 84a attached to its surface, the connector 85 is made of aluminum, the base portion 86 is made of aluminum, the support portion 88 is made of aluminum, the pivot axis 87 is made of screw, and the end effector 82 is made of ceramic or SiC.

Figure 14:
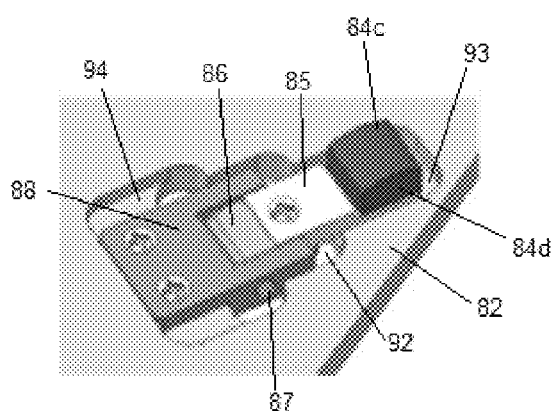
FIG. 14 is a schematic perspective view of an anti-slip protrusion body according to an embodiment of the present invention.

FIG. 14 is a schematic perspective view of an anti-slip protrusion body according to an embodiment of the present invention. The configuration of the anti-slip protrusion body and the installation method are the same as in the anti-slip protrusion body illustrated in FIGS. 12 and 13, except that a top face 84c provided on the top portion 84d is curved so that sudden separation of the backside of the workpiece from the top face can effectively be prevented. The curvature of the curved portion may be smaller in the center and gradually becomes greater toward the distal end of the top face.

Figure 2:
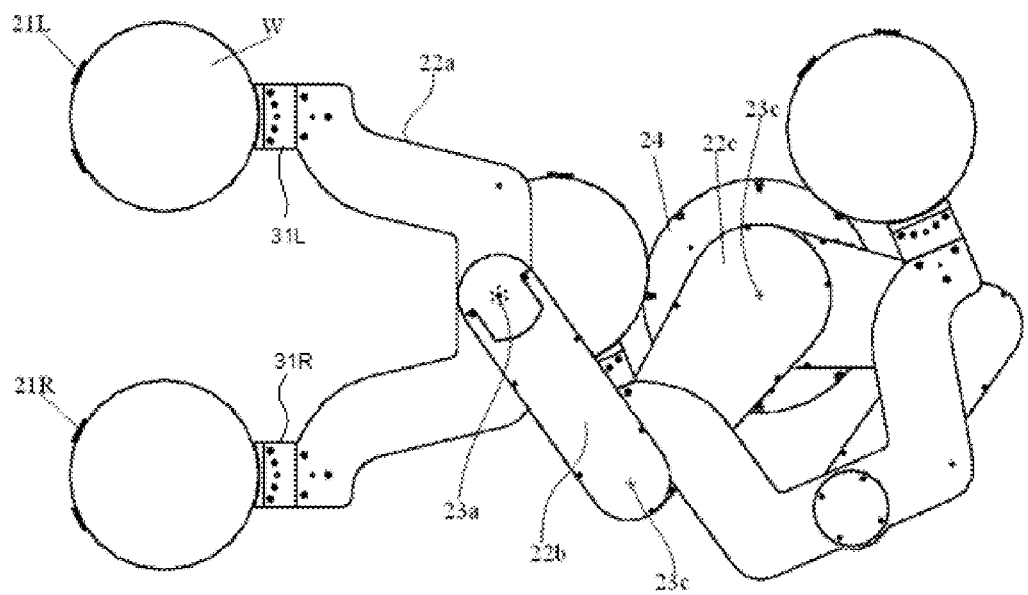
FIG. 2 is a schematic plan view of a dual-arm wafer-handling robot usable in some embodiments of the present invention.

The end effector is configured to be attached to a robotic arm as illustrated in FIG. 2. FIG. 2 is a schematic plan view of a dual arm wafer-handling robot usable in some embodiments of the present invention. In some embodiments, this type of dual-arm wafer-handling robot can preferably be used in an apparatus illustrated in FIG. 1. However, when the number of process chambers is four or less, for example, a single-arm wafer-handling robot can be used (which is typically a multi-axis robot). As shown in FIG. 2, the robotic arm is comprised of a fork-shaped portion 22a, a middle portion 22b, and a bottom portion 22c. The fork-shaped portion 22a is equipped with end effectors 21R and 21L for supporting wafers thereon. The fork-shaped portion 22a and the middle portion 22b are connected via a joint 23a, the middle portion 22b and the bottom portion 22c are connected via a joint 23b, and the bottom portion is connected to an actuator 24 via a joint 23c. In some embodiments, any suitable wafer-handling robot can be used, such as those disclosed in U.S. Pat. No. 5,855,681, the disclosure of which is herein incorporated by reference in its entirety. In some embodiments, the robotic arm has a three-prong portion for conveying three wafers at once, instead of a fork-shaped portion. The distal ends of the fork-shaped portion 22a are provided with joint portions 31L, 31R, to which the joint section 48 of the end effector is attached. This robot arm is capable of controlling lateral motion of the end effector along an X axis, front and back motion thereof along a Y axis, vertical motion thereof along a Z axis, and rotational motion thereof about the Z axis.

FIG. 1 is a schematic plan view of a wafer-processing apparatus with dual chamber modules using the robot arm illustrated in FIG. 2 in some embodiments of the present invention. The wafer-processing apparatus combines four process modules 1a, 1b, 1c, 1d (each provided with two reactors 2), a wafer in/out chamber 5, and a wafer-handling chamber 4 provided with back end robots 3, desirably in conjunction with controls programmed to conduct the sequences described below, which can be used in some embodiments of the present invention. In this embodiment, the wafer-processing apparatus comprises: (i) eight reactors 2 (each having a right chamber (R) and a left chamber (L)) for processing wafers on the same plane, constituting four discrete process modules (units) 1a, 1b, 1c, 1d, each module 1 having two reactors 2 arranged side by side with their fronts aligned in a line; (ii) a wafer-handling chamber 4 including two back end robots 3 (wafer-handling robots), each having at least two end effectors accessible to the two reactors of each unit simultaneously, said wafer-handling chamber 4 having a polygonal shape having four sides corresponding to and being attached to the four process modules 1a, 1b, 1c, 1d, respectively, and one additional side for a wafer in/out chamber (load lock chamber) 5, all the sides being disposed on the same plane; and (iii) a wafer in/out chamber 5 for loading or unloading two wafers simultaneously, said wafer in/out chamber 5 being attached to the one additional side of the wafer-handling chamber, wherein each back end robot 3 is accessible to the wafer in/out chamber 5. The interior of each reactor 2 and the interior of the wafer in/out chamber 5 can be isolated from the interior of the wafer-handling chamber 4 by a gate valve 9. In some embodiments, a controller (not shown) stores software programmed to execute sequences of wafer transfer, for example. The controller also checks the status of each process chamber, positions wafers in each process chamber using sensing systems, controls a gas box and electric box for each module, controls a front end robot (FERB) 7 in an equipment front end module (EFEM) 6 based on a distribution status of wafers stored in loading ports (LP) 8 and a load lock chamber (LLC) 5, controls back end robots (BERB) 3, and controls gate valves (GV) 9 as shown in FIG. 1. A skilled artisan will appreciate that the apparatus includes one or more controller(s) programmed or otherwise configured to cause the deposition and reactor cleaning processes described elsewhere herein to be conducted. The controller(s) are communicated with the various power sources, heating systems, pumps, robotics and gas flow controllers or valves of the reactor, as will be appreciated by the skilled artisan.

In some embodiments, the apparatus has any number of process chambers greater than one (e.g., 2, 3, 4, 5, 6, or 7). In FIG. 1, the apparatus has eight process chambers, but it can have ten or more. Typically, the apparatus has one or more dual-chamber modules. In some embodiments, the reactors of the modules can be any suitable reactors for processing or treating wafers, including CVD reactors such as plasma-enhanced CVD reactors and thermal CVD reactors, ALD reactors such as plasma-enhanced ALD reactors and thermal ALD reactors, etching reactors, and UV-curing reactors. Typically, the process chambers are plasma reactors for depositing a thin film or layer on a wafer. In some embodiments, all the modules are of the same type having identical capability for treating wafers so that the unloading/loading can sequentially and regularly be timed, thereby increasing productivity or throughput. In some embodiments, the modules have different capacities (e.g., different treatments) but their handling times are substantially identical.

The apparatus disclosed in U.S. Patent Application Publication No. 2012/0305196 can be used in some embodiments, the disclosure of which patent is herein incorporated by reference in its entirety. In some embodiments, any suitable wafer positioning system such as those disclosed in U.S. Patent Application Publication No. 2012/0325148, U.S. Pat. No. 7,963,736, and U.S. Pat. No. 8,041,450 can be employed, each disclosure of which is herein incorporated by reference in its entirety.

It will be understood by those of skill in the art that numerous and various modifications can be made without departing from the spirit of the present invention. Therefore, it should be clearly understood that the forms of the present invention are illustrative only and are not intended to limit the scope of the present invention.

I claim:

1. An anti-slip end effector for transporting a workpiece, configured to be attached to a robotic arm and comprising:
    a workpiece-supporting area for placing a workpiece thereon for transportation; and
    at least one anti-slip protrusion disposed in the workpiece-supporting area for supporting a backside of the workpiece, said anti-slip protrusion having a top face capable of contacting and adhering to the backside of the workpiece by van der Waals force and capable of pivoting on a pivot axis, said pivot axis being disposed away from a center of the top face as viewed from above, wherein:
    the anti-slip protrusion has (i) a base portion through which the pivot axis passes, and (ii) a top portion formed directly or indirectly on top of the base portion and extending in one direction roughly parallel to the workpiece-supporting area, wherein a top surface of the top portion constitutes the top face,
    the workpiece-supporting area has a recess inside which the base portion of the anti-slip protrusion is disposed,
    a backside of the top portion of the anti-slip protrusion is in contact with a surface of the workpiece-supporting area when the workpiece is placed on the top face of the top portion at a lowest position, and the anti-slip protrusion is capable of pivoting in a manner moving the backside of the top portion of the anti-slip protrusion entirely away from the surface of the workpiece-supporting area as the workpiece is moving upward from the lowest position,
    the top face formed on the top portion of the anti-slip protrusion has a contacting area which is brought into contact with the backside of the workpiece when the workpiece is placed on the workpiece-supporting area, wherein the contacting area is located between the pivot axis and the end of the top portion on the extended side as viewed from above, and
    the top face formed on the top portion of the anti-slip protrusion is curved between the contacting area and a front end of the top portion on the extended side, and the center of gravity of the anti-slip protrusion is disposed between the pivot axis and the front end of the top portion on the curved, extended side as viewed from above.

2. The anti-slip end effector according to claim 1, wherein the top face of the anti-slip protrusion is constituted by numerous carbon nanotubes.

3. The anti-slip end effector according to claim 1, wherein the at least one anti-slip protrusion is constituted by multiple anti-slip protrusions disposed left-right symmetrically relative to a center line of the end effector extending from a proximal end to a distal end of the end effector, and the pivot axis of each anti-slip protrusion is disposed perpendicular to a line passing through a center of the workpiece-supporting area as viewed from above.

4. The anti-slip end effector according to claim 1, wherein the base portion has roughly an inverted triangle cross section, wherein the pivot axis passes through the base portion at a location near the lower end of the inverted triangle cross section.

5. The anti-slip end effector according to claim 1, wherein the top portion of the anti-slip protrusion has a height of about 0.5 mm to about 7.0 mm, whereas the base portion of the anti-slip protrusion has a height of about 2.0 mm to about 28.0 mm.

6. The anti-slip end effector according to claim 1, wherein the top face formed on the top portion of the anti-slip protrusion is curved toward an end of the top portion on the extended side.

7. The anti-slip end effector according to claim 1, wherein the top face is constituted by a carbon nanotube-based synthetic gecko tape attached to a top surface of the anti-slip protrusion which is made of a material selected from the group consisting of ceramics, silicon, glass, and resin.

8. The anti-slip end effector according to claim 1, wherein the top face is constituted by carbon nanotubes directly deposited on a top surface of the anti-slip protrusion which is made of silicon.

9. The anti-slip end effector according to claim 1, wherein the anti-slip protrusion is pivoted so as to return to the home position by gravity after pivoting in a manner moving the top portion of the anti-slip protrusion away from the surface of the workpiece-supporting area.

10. The anti-slip end effector according to claim 1, wherein the top face formed on the top portion of the anti-slip protrusion has an oblong shape which is longer in a direction perpendicular to the pivot axis than in a direction of the pivot axis as viewed from above.

11. The anti-slip end effector according to claim 1, wherein the top face of the at least one anti-slip protrusion is the only area which contacts the backside of the workpiece when the workpiece is placed on the workpiece-supporting area.

12. The anti-slip end effector according to claim 1, further comprising at least one front protrusion disposed at a distal end of the workpiece-supporting area for engaging an edge of the workpiece to restrict movement of the workpiece placed on the workpiece-supporting area beyond the front protrusion, and at least one rear protrusion disposed at a proximal end of the workpiece-supporting area for engaging an edge of the workpiece to restrict movement of the workpiece placed on the workpiece-supporting area beyond the rear protrusion.

13. The anti-slip end effector according to claim 1, wherein the workpiece-supporting area is constituted by ceramics, carbon composite, and aluminum alloys.

14. A robotic arm for transporting a workpiece, comprising at least one arm which is movable vertically, front and rear, and laterally, and the anti-slip end effector of claim 1 attached to a distal end of each arm.

15. A method of transporting a workpiece using the anti-slip end effector of claim 1, comprising:
    providing a robot arm to which the end effector is attached;
    loading a workpiece on the workpiece-supporting area of the end effector, wherein the backside of the workpiece is attached to the top face of each anti-slip protrusion;

transporting the workpiece from one chamber to another chamber using the robot arm while keeping the workpiece on the workpiece-supporting area of the end effector; and unloading the workpiece in the other chamber by relatively moving the workpiece away from the end effector, wherein the top face of each anti-slip protrusion pivots on the pivot axis and is gradually detached from the backside of the workpiece while moving the workpiece away from the end effector.

* * * * *